(12) United States Patent
Park

(10) Patent No.: US 7,745,251 B2
(45) Date of Patent: Jun. 29, 2010

(54) METHOD OF FABRICATING CMOS IMAGE SENSOR

(75) Inventor: Jeong-Su Park, Seoul (KR)

(73) Assignee: Dongbu HiTeck Co., Ltd., Seoul (KR)

( * ) Notice: Subject to any disclaimer, the term of this patent is extended or adjusted under 35 U.S.C. 154(b) by 255 days.

(21) Appl. No.: 11/831,401

(22) Filed: Jul. 31, 2007

(65) Prior Publication Data

US 2008/0044942 A1 Feb. 21, 2008

(30) Foreign Application Priority Data

Aug. 16, 2006 (KR) ............... 10-2006-0077006

(51) Int. Cl.
*H01L 21/00* (2006.01)

(52) U.S. Cl. ............... 438/73; 438/65; 257/E33.001

(58) Field of Classification Search ............ 438/65, 438/69, 73; 257/E21.001, E33.001
See application file for complete search history.

(56) References Cited

U.S. PATENT DOCUMENTS 6,040,593 A * 3/2000 Park ............... 257/292
2006/0138494 A1* 6/2006 Lee ............... 257/292

\* cited by examiner

*Primary Examiner*—Walter L Lindsay, Jr.
(74) *Attorney, Agent, or Firm*—Sherr & Vaughn, PLLC

(57) ABSTRACT

A method of manufacturing a complimentary metal oxide semiconductor (CMOS) image sensor. The method includes a step of performing a silicide process relative to a plug for transferring electrons generated from a photodiode. The silicide of the plug blocks light irradiated through the plug, so that the performance of the image sensor may be optimized.

10 Claims, 4 Drawing Sheets

METHOD OF FABRICATING CMOS IMAGE SENSOR

Figure 1A:
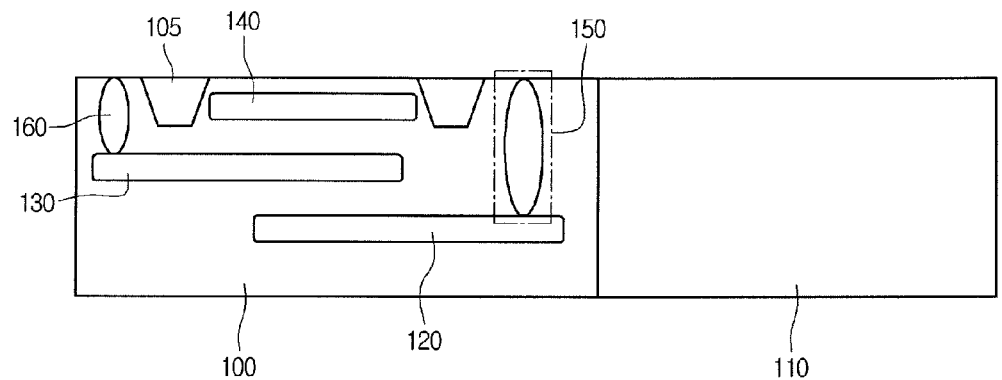

The present application claims priority under 35 U.S.C. 119 to Korean Patent Application No. 10-2006-77006 (filed on Aug. 16, 2006), which is hereby incorporated by reference in its entirety.

BACKGROUND

A CMOS image sensor is a device which may covert optical images into electrical signals using machine vision. A CMOS image sensor may include a pixel region which responds to the optical signals and a periphery region that does not respond to optical signals. A pixel region may generate electricity through photoelectric effect in response to light.

A silicide process may be performed when a CMOS image sensor is manufactured. In a silicide process, metal may be diffused into a silicon substrate to lower the resistance. A silicide process may be used to maintain relatively high performance of a device. Silicide may be formed regions outside a pixel region. Silicide formed in a pixel region may degrade electrical characteristics of a device by lowering light transmittance and causing junction leakage.

A plug (e.g. a conductive plug) may connect to a photodiode in the pixel region. A silicide process may not be performed with relation to the plug. Accordingly, a plug may not have silicide formed on it. A plug may receive a portion of the light irradiated onto the pixel region, which may generate some electrons from a photoelectric effect. As a result, electrons generated by the plug may cause undesirable electrical signals (e.g. noise) in an image sensor, which may compromise performance and reliability of an image sensor.

SUMMARY

Embodiment relates to a method of fabricating a complimentary metal oxide semiconductor (CMOS) image sensor. In embodiments, a method of fabricating a CMOS image sensor, a plug making contact with a photodiode is silicided, which may optimize performance of a CMOS image sensor. Embodiment relate to a method of manufacturing a CMOS image sensor in which silicide is formed on a plug in a pixel region. According to embodiments, a silicide layer is formed on a plug region in the CMOS image sensor, so that silicide at the plug blocks light from being irradiated onto the plug, which may optimize performance of the image sensor.

In embodiments, a method of manufacturing a CMOS image sensor includes at least one of the following steps: Forming a pixel region and a peripheral region on a semiconductor substrate. Sequentially forming a red detection diode, a green detection diode, and a blue detection diode in the pixel region in a direction parallel to a surface of the substrate such that the red detection diode, the green detection diode and the blue detection diode are spaced apart from each other. Performing an ion implantation process to form a first plug and a second plug making contact with the red detection diode and the green detection diode, respectively. Forming a silicide passivation layer on the semiconductor substrate. Removing a portion of the silicide passivation layer formed on the peripheral region, the first plug and the second plug. Forming a silicide layer on the peripheral region, the first plug, and the second plug.

Embodiments relate to a CMOS image sensor including at least one of the following: A semiconductor substrate including a pixel region and a peripheral region. A red detection diode, a green detection diode, and a blue detection diode formed in the pixel region. A first plug and a second plug which make contact with the red detection diode or the green detection diode. A silicide layer formed in the peripheral region and over the first plug and the second plug.

DRAWINGS

Figure 1B:
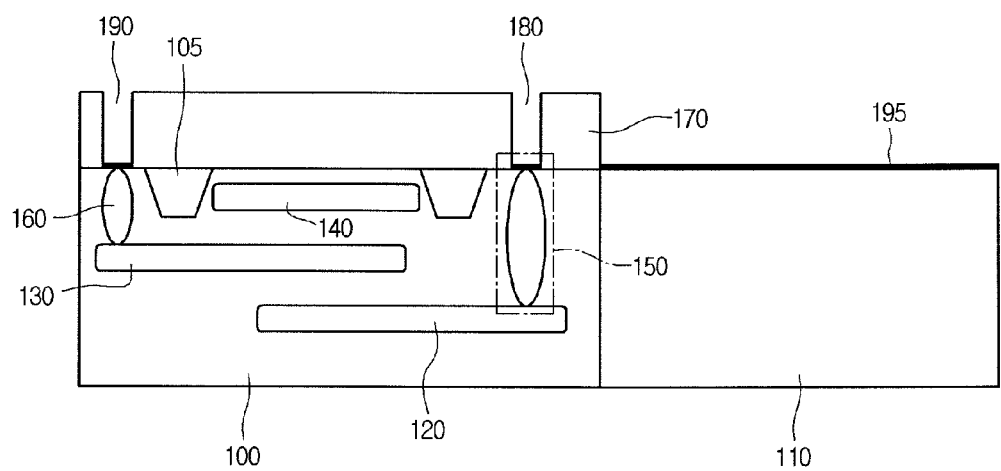
Figure 1C:
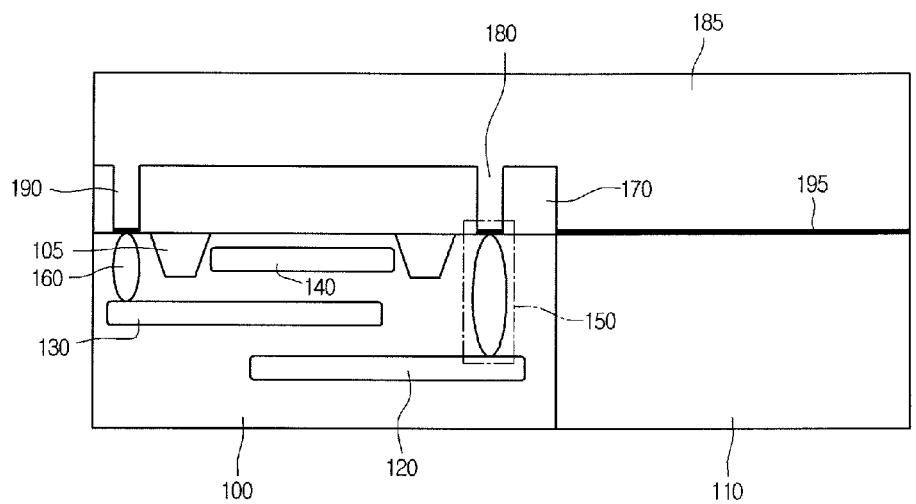

Example FIG. 1A to FIG. 1C illustrate a method of manufacturing a CMOS image sensor, according to embodiments.

Example FIGS. 2A to 2E illustrate a method of manufacturing a CMOS image sensor, according to embodiments.

DESCRIPTION

Example FIGS. 1A to 1C are sectional views illustrating a method of manufacturing a Complementary Metal Oxide Semiconductor (CMOS) image sensor according to embodiments. As illustrated in FIG. 1A, a semiconductor substrate may have pixel region 100 and peripheral region 110, in accordance with embodiments. Red detection diode 120 may be formed in pixel region 100, which may generate photocharges in response to red light. Green detection diode 130 may be formed in pixel region 100, which may generate photocharges in response to green light. Blue detection diode 140 may be formed in pixel region 100, which may generate photocharges in response to blue light. Diodes may be formed through an ion implantation process, in accordance with embodiments. Although diodes are illustrated as having the colors blue, green, and red, one of ordinary skill would appreciate other colors, in accordance with embodiments.

First plug 150 may be formed in pixel region 100. First plug 150 may make contact with red detection diode 120. Second plug 160 may be formed in pixel region 100. Second plug 160 may make contact with green detection diode 130. Plugs may be formed by implanting ions in a substrate, in accordance with embodiments. Shallow Trench Isolation (STI) 105 may be formed in pixel region 100.

As illustrated in example FIG. 1B, silicide passivation layer 170 may be formed on and/or over a semiconductor substrate including pixel region 100 and peripheral region 110, in accordance with embodiments. Silicide passivation layer 170 may include an oxide layer (e.g. tetraethylortho silicate (TEOS)). Silicide passivation layer 170 may be deposited through chemical vapor deposition (CVD). Portions of silicide passivation layer 170 may be removed over peripheral region 100, first plug 150, and second plug 160. Portion of silicide passivation layer 170 may be removed through an etching process.

After removing portions of silicide passivation layer 170, first plug region 180 over first plug 150, a second plug region 190 over second plug 160, and peripheral region 110 may be exposed, while silicide passivation layer 170 remains over red detection diode 120, green detection diode 130, and blue detection diode 140. In embodiments, a silicide process may be performed on the semiconductor substrate to form silicide layer 195 on peripheral region 110 and in the exposed areas of pixel region 100 (e.g. forming silicide layer 195 over the first plug region 180 and second plug region 190). In embodiments, silicide layer 195 may be formed by sputtering metal material (e.g. cobalt and/or tungsten) on the substrate and annealing the metal material.

As shown in FIG. 1C, oxide layer 185 may be formed (e.g. coated) on and/or over the substrate. A metallization process and a contact process may be performed after forming oxide layer 185. In embodiments, oxide layer 185 may include Phosphorous Silica Glass (PSG) and/or Undoped Silica Glass (USG). A metallization may be a process of forming metal interconnections on and/or over oxide layer 185. A contact process may be a process of forming contacts for electrically connecting metal interconnections with the semiconductor substrate and/or a gate electrode. In embodiments, silicide layer 195 may block light irradiated onto first plug region 180 and second plug region 190, which may minimize current leakage and/or electrical noise.

Example FIGS. 2A to 2D illustrate a process of manufacturing a CMOS image sensor, according to embodiments. As illustrated in example FIG. 2A, a semiconductor substrate includes pixel region 210 and peripheral region 200. Red detection diode 220, green detection diode 230, and blue detection diode 240 are formed in the semiconductor substrate in a pixel region 210. First plug 250 and second plug 260 are formed in pixel region 210. First plug 250 may contact red detection diode 220. Second plug 260 may contact green detection diode 230. First plug 250 and/or second plug 260 may be formed by an ion implantation process, in accordance with embodiments.

In embodiments, the depth of first plug 250 may be greater than second plug 260. First plug 250 may be formed through a two-step ion implantation process, in accordance with embodiments. Lower structure 250a of first plug 250 may be formed by a first ion implantation. Lower structure may contact red detection diode 220. Upper structure 250b of first plug 250 may be formed on and/or over lower structure 250a by a second ion implantation. Second plug 260 may be formed to contact green detection diode 230. In embodiments, second plug 260 and upper structure 250b of first plug 250 may be formed in the same ion implantation process. In other words, upper structure 250b of first plug 250 and second plug may be formed simultaneously, in accordance with embodiments. When electrons are generated from a photodiode in response to irradiated light, plugs 250 and 260 serve as conductive paths through which electrons are transferred from the photodiode to a transistor (e.g. in peripheral region 200). STI 205 may be formed in the semiconductor substrate.

Figure 2A:
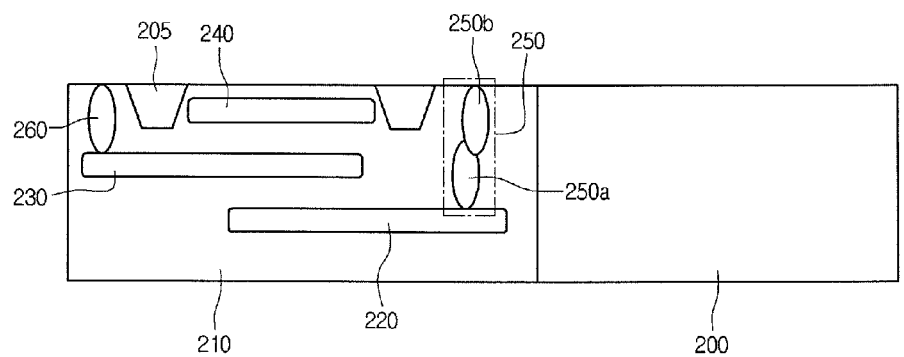
Figure 2B:
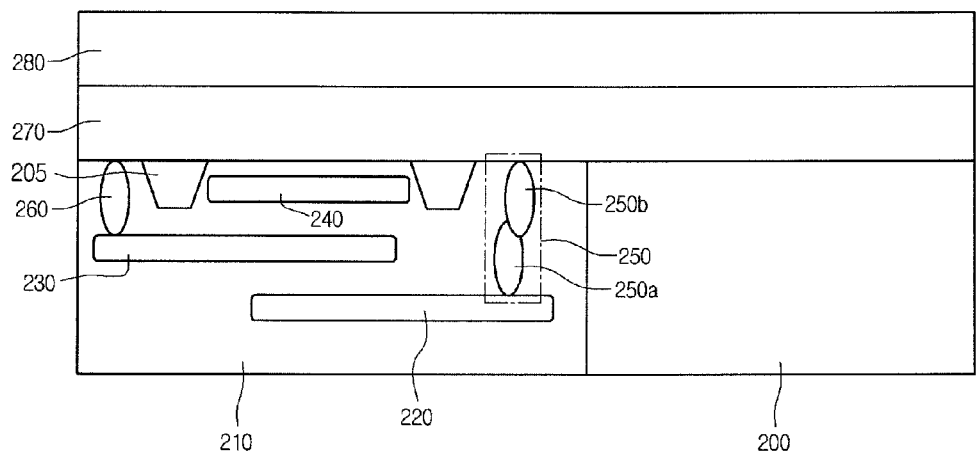
Figure 2C:
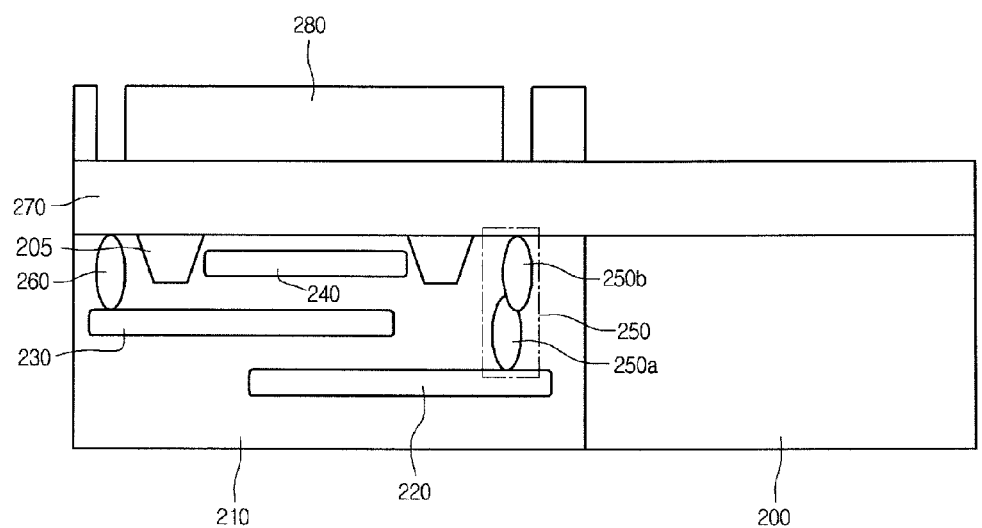

As illustrated in example FIG. 2B, silicide passivation layer 270 may be formed on and/or over the semiconductor substrate, in accordance with embodiments. Photoresist 280 may be formed (e.g. deposited) on and/or over silicide passivation layer 270. As illustrated in example FIG. 2C, photoresist 280 may be selectively etched to remove portions of photoresist on and/or over peripheral region 200, first plug 250 and second plug 260, in accordance with embodiments. Accordingly, the silicide passivation layer 270 may be selectively exposed above peripheral region 200, first plug 250 and second plug 260.

Figure 2D:
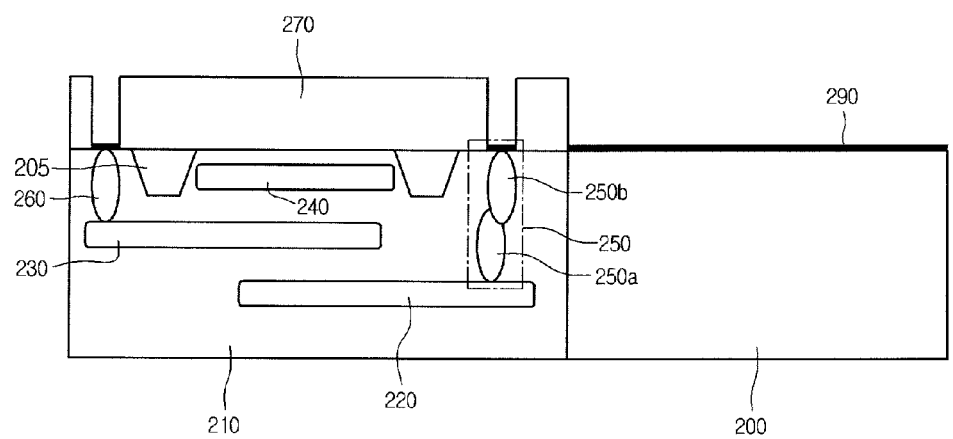

As illustrated in example FIG. 2D, silicide passivation layer 270 may be selectively etched using photoresist 280, in accordance with embodiments. After silicide passivation layer 270 is selectively etched, photoresist 280 may be removed, in accordance with embodiments. Silicide passivation layer 270 may be selectively etched to expose the semiconductor substrate above peripheral region 200, first plug 250 and second plug 260. In embodiments, a silicide process may be performed to form silicide layer 290 on and/or over semiconductor substrate at peripheral region 200, first plug 250 and second plug 260, which are exposed through silicide passivation layer 270. In embodiments, a silicide process may be performed by sputtering metal material (e.g. cobalt or tungsten) onto the substrate and/or annealing the metal material.

Figure 2E:
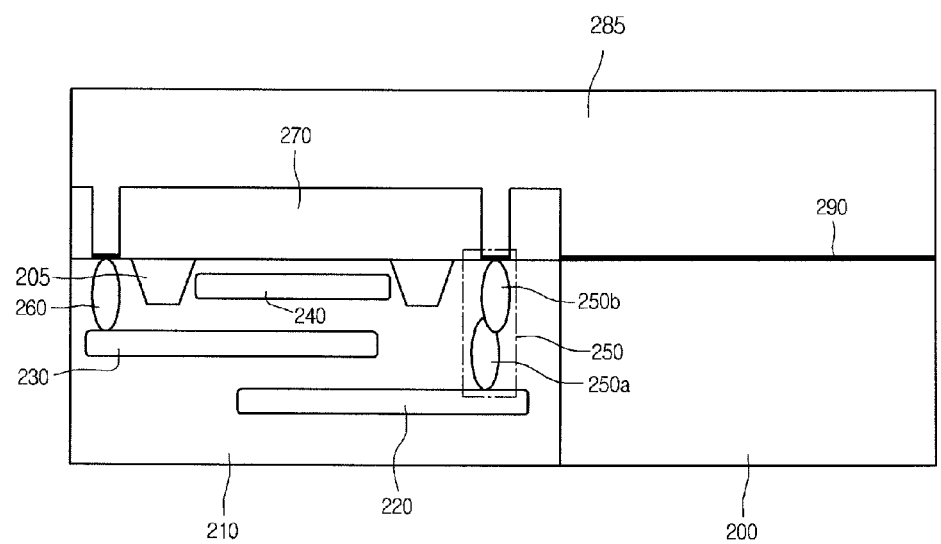

As illustrated in example FIG. 2E, oxide layer 285 may be formed (e.g. coated) on and/or over the substrate, in accordance with embodiments. In embodiments, a metallization process and/or a contact process may be performed. In embodiments, oxide layer 285 may include at least one of Phosphorous Silica Glass (PSG) and Undoped Silica Glass (USG).

In embodiments, a CMOS image sensor may include a pixel region that is silicided to prevent light from being transmitted into the plug, which may optimize the reliability and/or performance of the image sensor. In embodiments, performance of an image sensor may be improved by changing a photoresist patterning process without adding new processes.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming at least one photo diode in a semiconductor substrate;
   forming at least one contact plug in the semiconductor substrate; and
   selectively forming a silicide region over said at least one contact plug,
   wherein said at least one photo diode and said at least one contact plug are formed in a pixel region of the semiconductor substrate; and said selectively forming the silicide region over said at least one contact plug comprises forming the silicide region in a peripheral region of the semiconductor substrate.

2. The method of claim 1, wherein said selectively forming a silicide region over said at least one contact plug comprises:
   forming a silicide passivation layer over said at least one photo diode; and
   etching the silicide passivation layer over said at least one contact plug to expose a surface of the semiconductor substrate over said at least one contact plug.

3. The method of claim 1, wherein the method is a method of manufacturing a CMOS image sensor.

4. The method of claim 1, wherein said at least one photo diode comprises:
   a red detection diode;
   a green detection diode; and
   a blue detection diode.

5. The method of claim 4, wherein:
   said at least one contact plug comprises a first plug and a second plug;
   the first plug contacts the red detection diode; and
   the second plug contacts the green detection diode.

6. The method of claim 5, wherein:
   the red detection diode is formed below the green detection diode; and
   the first plug is formed by a first ion implantation process and a second ion implantation process.

7. The method of claim 6, wherein the second plug is formed by the second ion implantation process.

8. The method of claim 1, wherein said selectively forming the suicide region comprises:
   sputtering metal; and
   annealing the metal.

9. The method of claim 1, comprising:
   forming an oxide layer over the semiconductor substrate; and
   forming a metal interconnection and a contact.

10. The method of claim 9, wherein the oxide layer comprises at least one of Phosphorous Silica Glass (PSG) and Undoped Silica Glass (USG).

* * * * *